United States Patent
Liao et al.

(10) Patent No.: US 7,014,965 B2
(45) Date of Patent: Mar. 21, 2006

(54) PHOTOLITHOGRAPHY METHOD FOR REDUCING EFFECTS OF LENS ABERRATION

(75) Inventors: Chun-Cheng Liao, Panchiao (TW); Yuan-Hsun Wu, Jungli (TW)

(73) Assignee: Nanya Technology Corporation, Taoyuan (TW)

( * ) Notice: Subject to any disclaimer, the term of this patent is extended or adjusted under 35 U.S.C. 154(b) by 404 days.

(21) Appl. No.: 10/640,095

(22) Filed: Aug. 13, 2003

(65) Prior Publication Data

US 2005/0100827 A1    May 12, 2005

(30) Foreign Application Priority Data

Jan. 15, 2003    (TW) .............................. 92100761 A

(51) Int. Cl.
*G03C 5/00* (2006.01)
*G03F 9/00* (2006.01)

(52) U.S. Cl. .......................... 430/30; 430/22; 430/312; 430/313; 430/316

(58) Field of Classification Search ................. 430/22, 430/30, 312, 313, 316
See application file for complete search history.

(56) References Cited

U.S. PATENT DOCUMENTS

| | | | |
|---|---|---|---|
| 6,529,623 B1 * | 3/2003 | Kent | 382/149 |
| 6,563,564 B1 * | 5/2003 | de Mol et al. | 355/52 |
| 2003/0091913 A1 * | 5/2003 | Shiode | 430/22 |

* cited by examiner

*Primary Examiner*—Christopher G. Young
(74) *Attorney, Agent, or Firm*—Quintero Law Office

(57) ABSTRACT

A photolithography method for reducing effects of lens aberration. A photolithography apparatus is provided with a first reticle therein, having at least one first rectangular pattern thereon, a first photolithography is performed on a wafer by the photolithography apparatus to transfer the first rectangular pattern thereonto by simultaneously moving the first reticle and the wafer in a direction parallel to the short sides of the first rectangular pattern. The first reticle is replaced with a second reticle having at least one second rectangular pattern thereon and a second photolithography is performed by the photolithography apparatus to transfer the second rectangular pattern onto the wafer by simultaneously moving the second reticle and the wafer in a 90° plus or minus rotation in a direction parallel to the short sides of the second rectangular pattern.

18 Claims, 6 Drawing Sheets

PHOTOLITHOGRAPHY METHOD FOR REDUCING EFFECTS OF LENS ABERRATION

BACKGROUND OF THE INVENTION

1. Field of the Invention

The present invention relates to the field of semiconductor device manufacturing, and in particular to a photolithography method for reducing effects of lens aberration.

2. Description of the Related Art

The manufacture of complex semiconductor devices involves defining multiple layers of device features onto a substrate using photolithography techniques. To achieve proper electrical contact between the different layers or levels of device features, each layer must be accurately aligned with the previous underlying layer. Misalignment of a layer of device features with respect to the previous underlying layer can result in unintended openings or shorts between device features on different levels, causing failure of the entire product.

Alignments of layers of device features has conventionally been achieved through the use of overlay targets, typically box-in-box targets, located in the kerf surrounding the outer edge of a chip product area on a semiconductor wafer. In addition, the alignment within each single layer of device features has conventionally been achieved through the use of global alignment marks located in the kerf of non-chip product area at the outer edge of a semiconductor wafer and the use of the local alignment marks located in the kerf between chips on a semiconductor wafer. Once the box-in-box targets, the local alignment marks and the global alignment marks are proper aligned, it is assumed that a single layer of the device features within the product field will also proper alignment. Nevertheless, it has been observed that significant overlay errors such as asymmetry, distortion and poor critical diameter (CD) uniformity of the transferred patterns can occur within the product area even when all the described alignment marks are proper alignment and the box-in-box overlay error is driven to zero. The unintended phenomenon can be result of lens aberration from lens failure such as, for example, projection lens within the optical projection system of a photolithography apparatus and the common lens aberrations exhibiting spherical aberration, astigmatism, coma, field curvature or distortion.

In FIG. 1, a schematic diagram of step-scanner 5, one type of photolithography apparatus, is illustrated and abbreviated to scanner 5 hereinafter. In a photolithography process performed by the scanner 5, light source (not shown) projects light L through slit field S of masking blades 10, through the transparent portions of a pattern on reticle 12 disposed on reticle platform 14, through projection lens (not shown) in optic projection system 16, focusing onto wafer 18 disposed on wafer platform 20. During the described photolithography process, reticle platform 14 and wafer platform 20 move simultaneously and light L scans the reticle 12 to transfer patterns thereon onto wafer 18 step-by-step. Movements of reticle platform 14 and wafer platform 20 can be the same or opposite upon the practical arrangement of the optic projection system 16.

In FIG. 2a to FIG. 2d, portions of the conventional photolithography process for fabricating a trench-type dynamic random access memory (DRAM) are illustrated and the photolithography apparatus used here is, for example, the described scanner 5.

In FIG. 2a, a first reticle 12a is provided and disposed onto the reticle platform 14 (not shown). In the first reticle 12a, overlay targets 100 located at corners thereof and specific transfer patterns shown in area 105 are illustrated. The specific transfer patterns shown in area 105 can be, for example, a plurality of pairs of first rectangular transparent region 120 symmetrically disposed therein, surrounded by the opaque region 110. Each first rectangular transparent region 120 has short sides and long sides respectively parallel to the X and Y orientations shown in FIG. 2a.

In FIG. 2b, a wafer 18a having a notch 130 thereon as an orientation mark is provided. The orientation mark here is not restricted to the notch 130 of conventional 8 inch wafers and can be also, for example, a flat side of 6 inch wafers. In addition, a resist layer 133 formed by photosensitive materials is coated on the wafer 18a and other coated layers, for example anti-reflection coating (ARC) layer, for enhancing the photolithography result can be further formed thereon. Next, the wafer 18a coated with the resist layer 133 is disposed on the wafer platform 20 with the orientation mark 130 parallel to the Y orientation shown in FIG. 2b.

A first photolithography (not shown) is performed after proper alignment of the particular layer by moving the reticle platform 14 (not shown) and the wafer platform 20 in the same or opposite orientation parallel to the scanning direction 135, parallel to the long sides of the first rectangular transparent region 120, to transfer patterns of the first transparent rectangular region 120 onto the wafer 18a. After subsequent development and etching, first transferred patterns 120' for fabricating trench-capacitors, for example, are formed on the wafer 18a and shown in region 140 of FIG. 2b. The first transferred patterns 120' are slightly larger than the target CD of the first rectangular transparent regions 120 and poor critical dimensions (CD) of the first transferred patterns 120' in the short axis and asymmetry of each pair of first transferred patterns 120' affected by the lens aberration can be observed. Thus, a trench-type capacitor with the first transferred patterns 120' can be formed on the wafer 18a by subsequent fabricating processes (not shown).

In FIG. 2c, the previous reticle on the reticle platform 14 (not shown) is replaced with a second reticle 12b having overlay targets 100' located at corners thereof and a plurality of second rectangular transparent regions 170 surrounded by the opaque region 160. Each second transparent rectangular region 170 has long sides and short sides respectively parallel to the X and Y orientations in FIG. 2c.

In FIG. 2d, the previous wafer 18a, having trench-type capacitors thereon with the first transferred pattern 120' is again provided. In addition, a resist layer 183 formed by photosensitive materials is coated on the wafer 18a and other coated layers, for example anti-reflection coating (ARC) layer, for enhancing the photolithography result can be further formed thereon.

Next, the wafer 18a coated with the resist layer 183 thereon is disposed on the wafer platform 20 and the orientation mark 130 thereof is parallel to the Y orientation shown in FIG. 2d. Then a second photolithography (not shown) is performed after proper alignment of the particular layer by moving the reticle platform 14 (not shown) and the wafer platform 20 in the same or opposite orientation parallel to the scanning direction 165, parallel to the short sides of the second rectangular transparent region 170, to transfer patterns of the second transparent rectangular region 170 for fabricating, for example, active areas onto the wafer 18a. Thus, active areas for receiving ion implantation with the second transferred patterns 170' can be formed on the wafer 18a by performing subsequent fabricating processes (not shown). After subsequent development and etching (not shown), active areas with second transferred patterns 170' are formed on the wafer 18a shown in region 180 of FIG. 2d, for example, respectively overlying a pair of the underlying trench capacitors with the first transferred patterns 120'.

Thus, overlap regions D between the active areas with second transferred patterns 170' overlying the underlying trench capacitors with first transferred patterns 120' vary from one to the other. Poor critical dimension (CD) uniformity of the first transferred patterns 120' and asymmetry thereof impacted by lens aberration are observed. Thus, overlay errors occur and electrical performance of subsequently formed device features are also affected.

SUMMARY OF THE INVENTION

Accordingly, an object of the invention is to provide a photolithography method to reduce the impact of lens aberration. Poor CD uniformity and asymmetry of the transferred patterns affected by the lens aberration are improved and overlay errors of subsequent device features are also reduced.

Thus, a photolithography method for reducing effects of lens aberrations is provided by the invention. The photolithography method comprises the steps of providing a photolithography apparatus with a first reticle having at least one first rectangular transparent region thereon, providing a wafer coated with a resist layer thereon, a first photolithography through the photolithography apparatus to transfer the first rectangular transparent pattern onto the wafer by simultaneously moving the first reticle and the wafer coated with a resist layer thereon in a direction parallel to the short sides of the first transparent rectangular pattern, performing developing and etching to form a device with a first transferred pattern having a long axis and a short axis on the wafer, wherein the long axis is perpendicular to the moving direction of the wafer, replacing the first reticle with a second reticle having at least one second rectangular transparent pattern thereon, providing the wafer having a device with the first transferred pattern coated with a resist layer, performing a second photolithography through the photolithography apparatus to transfer the second rectangular transparent pattern onto the resist layer by simultaneously moving the second reticle and the wafer in a minus 90° or plus rotation in a direction parallel to the short sides of the second rectangular pattern and developing and etching to form a device with the second transferred pattern on the wafer, having a long axis and a short axis, and overlapping the device with first transferred pattern thereunder, wherein the long axis thereof is perpendicular to the short axis of the underlying device with first transfer pattern.

In the present invention, the short sides of the rectangular patterns of two separate reticles are parallel to the scanning direction in each photolithography. Two transferred patterns with orthogonal overlay structures are formed by rotating the wafer plus or minus 90° in one of the described photolithography processes and the average effects during the scanning processes thereof can reduce effects of lens aberration on the transferred patterns. Thus, overlap errors in the fabrications and electrical performances of overlapped device structure are improved.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

In FIG. 3a to FIG. 3e, portions of the photolithography processes for fabricating a trench-type dynamic random access memory (DRAM) in accordance of the invention for reducing effects of lens aberration are illustrated.

Figure 3A:
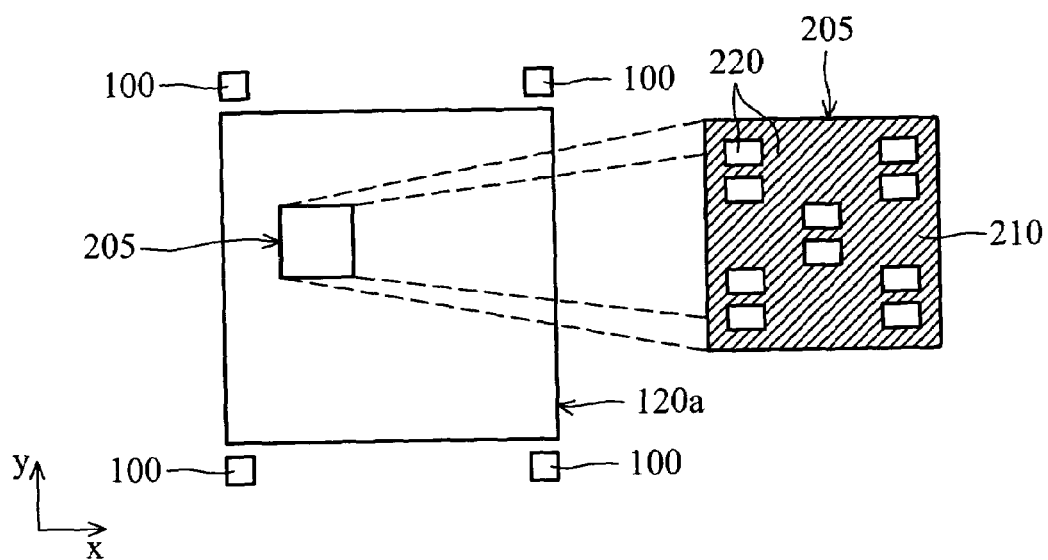
FIGS. 3a~3e are schematic views showing photolithographic effects of lens aberration in portions of the conventional trench-type DRAM improved by one embodiment of the invention.
Figure 3B:
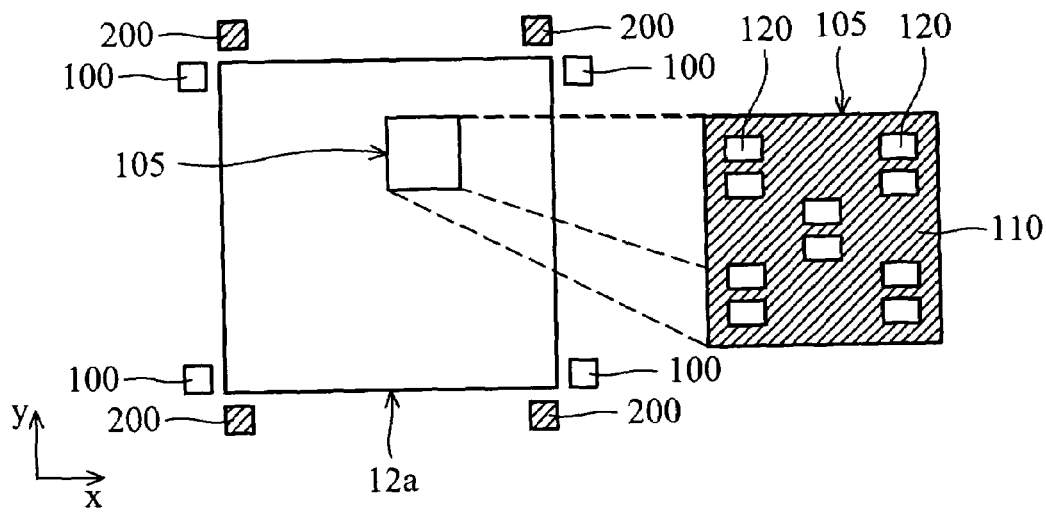

In the photolithography processes of the invention, a photolithography apparatus used here can be, for example, the described scanner 5 and is provided. A first reticle 120a disposed therein having overlay targets 100 located at corners thereof and specific transfer patterns shown in area 205 are illustrated. The specific transfer patterns shown in area 205 can be, for example, a plurality of pairs of first rectangular transparent regions 220 for fabricating trench capacitors, for example, symmetrically disposed in the first reticle 120a and surrounded by the opaque region 210. Each first rectangular transparent region 220 has long sides and short sides respectively parallel to the X and Y orientations shown in FIG. 3a. In addition, the first reticle 120a can be new or modified as shown in FIG. 3b by forming new overlay targets 200 onto the first reticle 12a after a plus or minus 90° rotation.

Figure 3C:
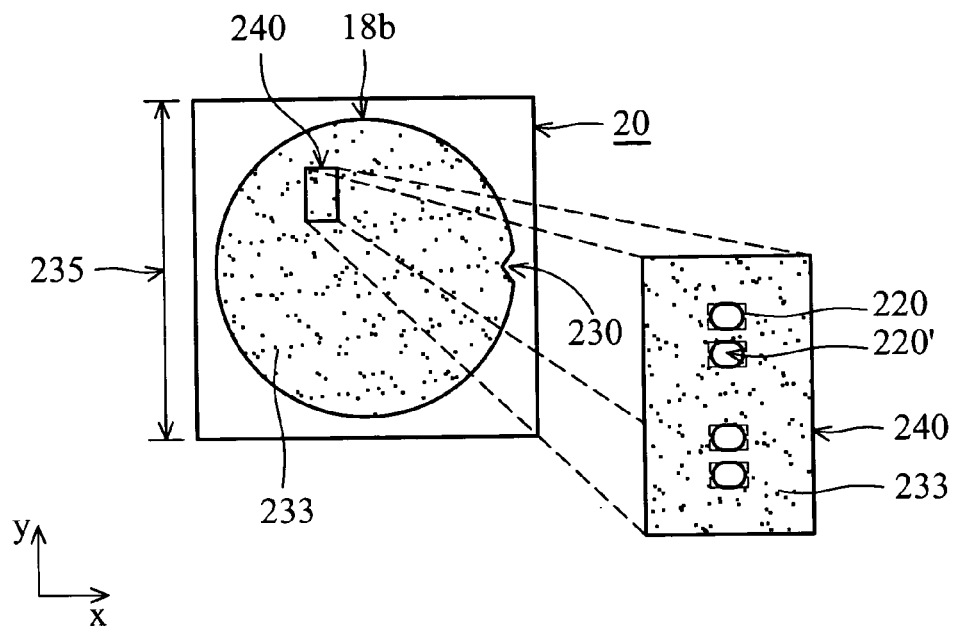

In FIG. 3c, a wafer 18b having a notch 230 thereon as an orientation mark is provided. The orientation mark here is not restricted to the notch 230 of conventional 8 inch wafers and can be also, for example, a flat side of 6 inch wafers. In addition, a resist layer 233 formed by, for example, photosensitive materials is coated on the wafer 18b and other coated layers, for example anti-reflection coating (ARC) layer, for enhancing the photolithography result can be further formed thereon. Next, the wafer 18b coated with the resist layer 133 is rotated minus 90° (or plus 90° depending on the practical pattern arrangement) and disposed on the wafer platform 20 with the orientation mark 230 parallel to the X orientation shown in FIG. 3c.

Then a first photolithography (not shown) is performed after proper alignment of the local layer by moving the reticle platform 14 (not shown) and the wafer platform 20 in the same or opposite orientation parallel to the scanning direction 235, parallel to the short sides of the first rectangular transparent region 220, to transfer patterns of the first transparent rectangular region 220 onto the wafer 18b. After subsequent development and etching, first transferred patterns 220' are formed on the wafer 18b and shown in region 240 shown in FIG. 3c. Thus, devices with first transferred patterns 220' such as trench-type capacitors (not shown) can be formed on the wafer 18b by subsequent trench-type capacitor fabricating processes.

In the described first photolithography in accordance with the present invention for forming the first transferred patterns 220', the wafer 18b moves parallel to the scanning direction 235 along the short sides of the first rectangular transparent regions 220 and the orientation mark 230 thereof is perpendicular to the movement of the wafer 18b. Thus, average effects during the scanning process of the first photolithography can reduce the effects of lens aberration to the first rectangular transparent region 220 of the first reticle 120a and pairs of first transferred patterns 220' with similar critical dimensions (CD) in the short axis thereof can be formed and better symmetry thereof can be also obtained.

Figure 3D:
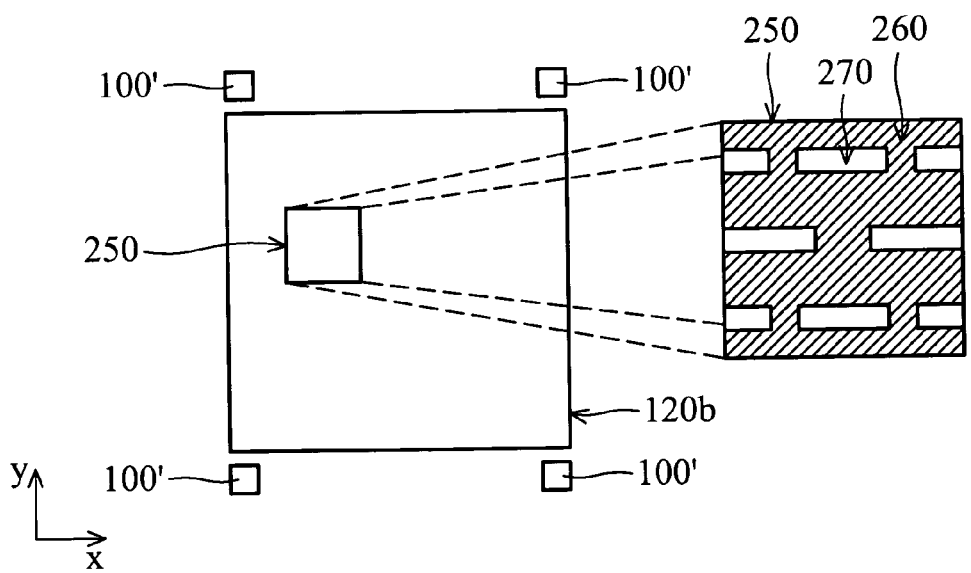

In FIG. 3d, the previous reticle on the reticle platform 14 (not shown) is replaced with a second reticle 220b having overlay targers 100' located at corners thereof and a plurality of second rectangular transparent regions 270 for fabricating active areas, for example, surrounded by the opaque region 260. Each second transparent rectangular region 270 has long sides and short sides respectively parallel to the X and Y orientations in FIG. 3d.

Figure 3E:
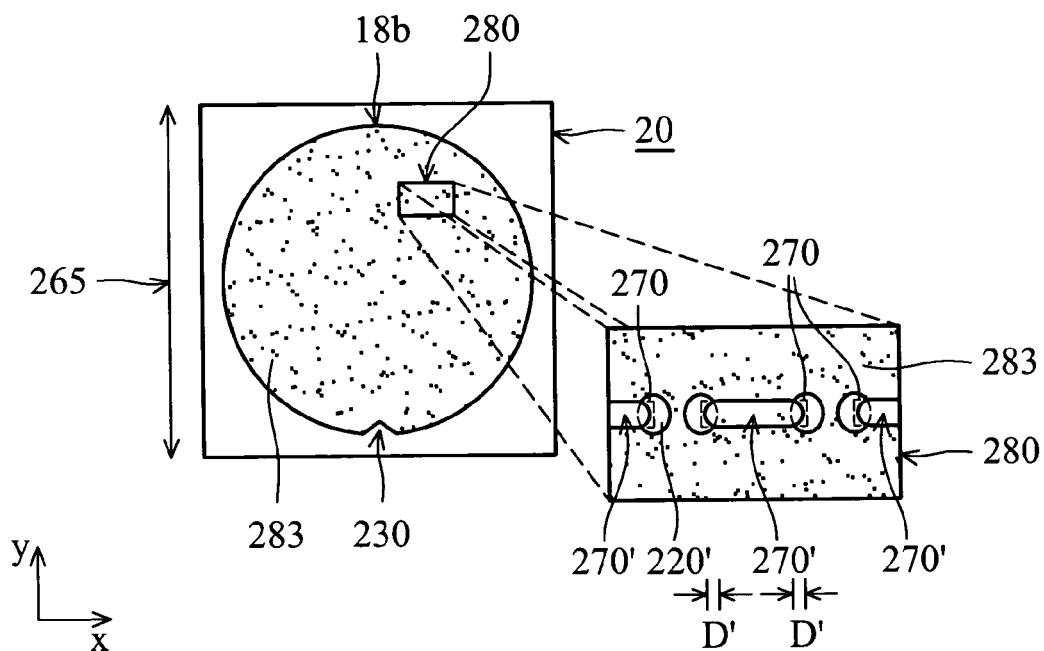

In FIG. 3e, the wafer 18b having devices with the first transferred patterns 220' such as trench-type capacitors thereon is again provided. In addition, another resist layer 283 formed by photosensitive materials is coated on the wafer 18b and other coated layers, for example anti-reflection coating (ARC) layer, for enhancing the photolithography result can be further formed thereon.

Next, the previous wafer 18b having devices with the first transferred patterns 220' coated with the resist layer 283 thereon is disposed on the wafer platform 20 and the orientation mark 230 thereof is parallel to the Y orientation shown in FIG. 3e. Then a second photolithography (not shown) is performed after proper alignment of the local layer by moving the reticle platform 14 (not shown) and the wafer platform 20 in the same or opposite orientation parallel to the scanning direction 265, parallel to short sides of the second rectangular transparent regions 270, to transfer patterns of the second transparent rectangular regions 270 onto the wafer 18b.

Thus, devices such as active areas with the second transferred patterns 270' having a long axis and a short axis receiving ion implantation can be formed on the wafer 18b by performing subsequent active areas fabricating processes. After subsequent development and etching (not shown), device features such as active areas with second transferred patterns 270' are formed on the wafer 18b shown in region 280 of FIG. 3e, for example, respectively overlying a pair of the underlying trench capacitors with the first transferred pattern 220'.

Moreover, effects of lens aberration to the underlying device features such as trench capacitors with first transferred patterns 220' are reduced by the photolithography method of the invention and pairs of first transferred patterns 220' with similar critical dimension (CD) uniformity and better symmetry can be obtained.

In addition, in the described second photolithography for forming the second transferred patterns 270', the wafer 18b moves parallel to the scanning direction 265 along the short side of the second rectangular transparent region 270 and the orientation mark 230 thereof is parallel to the moving direction of the wafer 18b. The average effects during the scanning process of the second photolithography can also reduce the effects of lens aberration on the second rectangular transparent regions 270 of the second reticle 120b.

Figure 1:
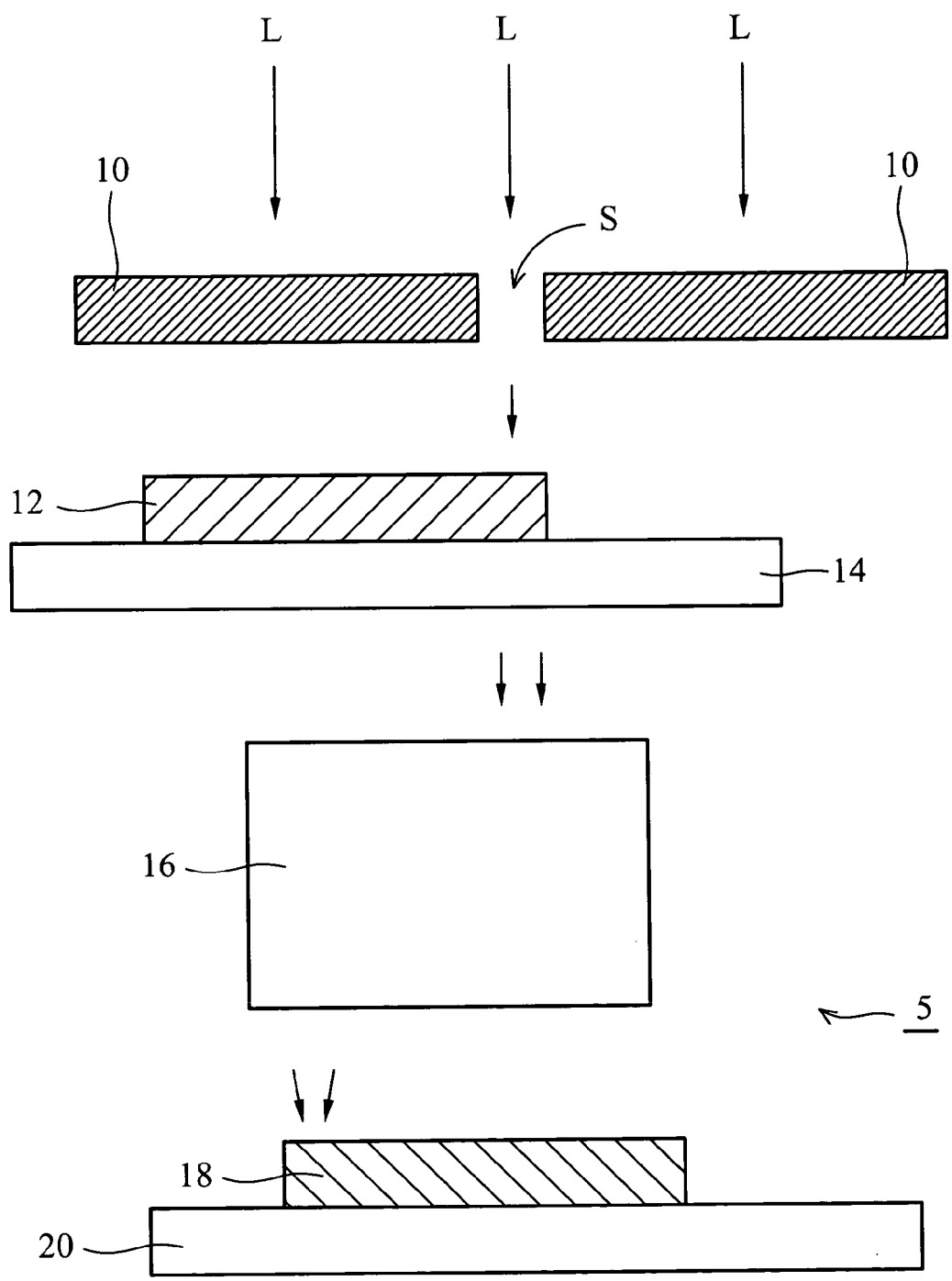
FIG. 1 is schematic diagram of a step-scanner photolithography apparatus in the Prior Art.
Figure 2A:
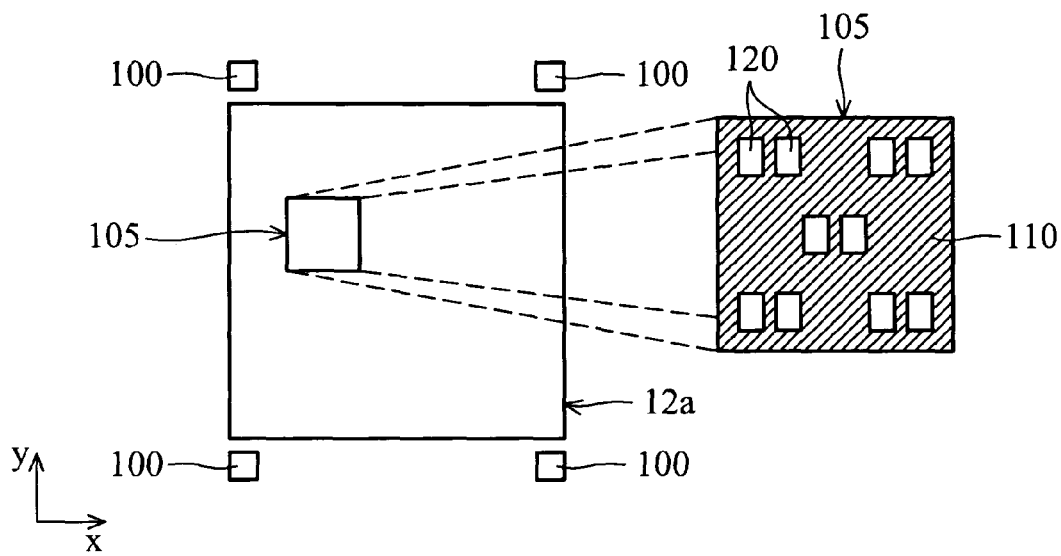
FIGS. 2a~2d are schematic views showing photolithographic effects of lens aberration in portions of the conventional trench-type DRAM processes in the Prior Art.
Figure 2B:
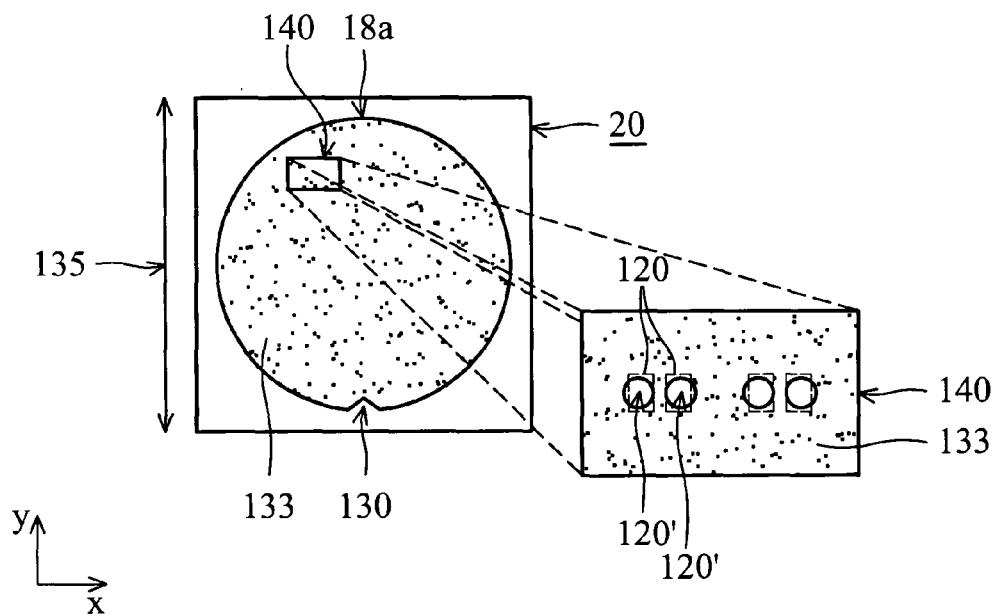
Figure 2C:
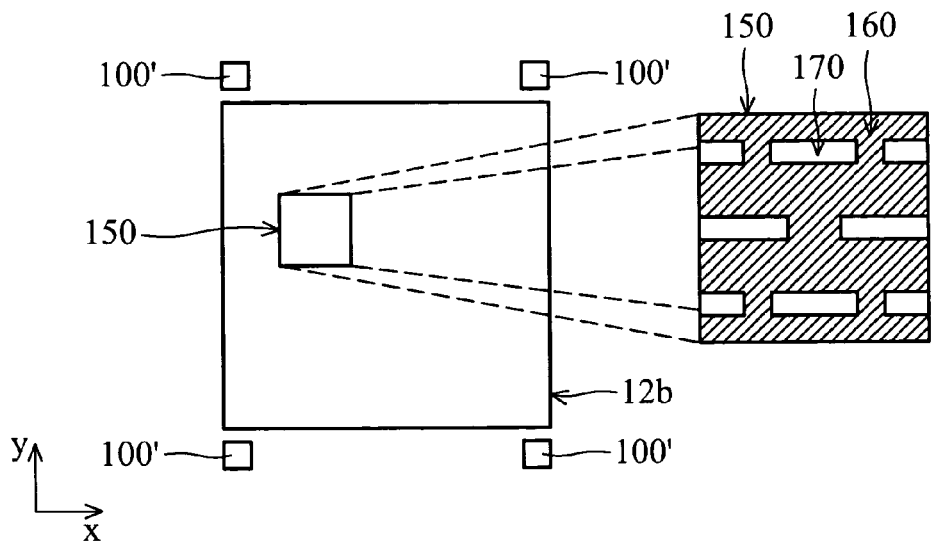
Figure 2D:
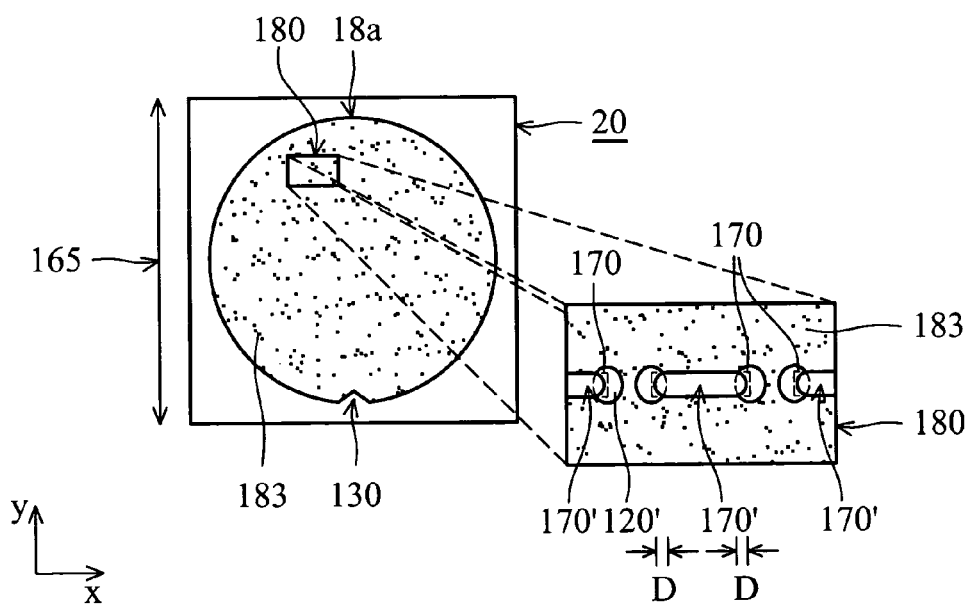

Therefore, overlap regions D' between devices with the second transferred patterns 170 respectively overlying each two underlying device features, for example trench capacitors with first transferred patterns 120', are similar and less than the overlap regions D shown in FIG. 2d affected by lens aberration. Thus, overlap errors in the fabrications can be avoided and electrical performance of subsequently formed devices is improved.

In the present invention, the short sides of the rectangular patterns of two separate reticles are parallel to the scanning direction in each photolithography. Two transferred patterns with orthogonal overlay structures are formed by rotating the wafer plus or minus 90° in one of the described photolithography processes and the average effects during the scanning processes thereof can reduce effects of lens aberration on the transferred patterns. Thus, overlap errors in the fabrications and electrical performances of overlapped device structure are improved.

The use of the photolithography method for reducing effects of lens aberration in accordance with the present invention is not restricted to the described trench-type DRAM fabricating processes and is suitable for any fabricating process having two separate reticles with orthogonal overlapping rectangular transfer pattern thereon. Using the photolithography method of the invention, better photolithography performances can be achieved.

Figure 4:
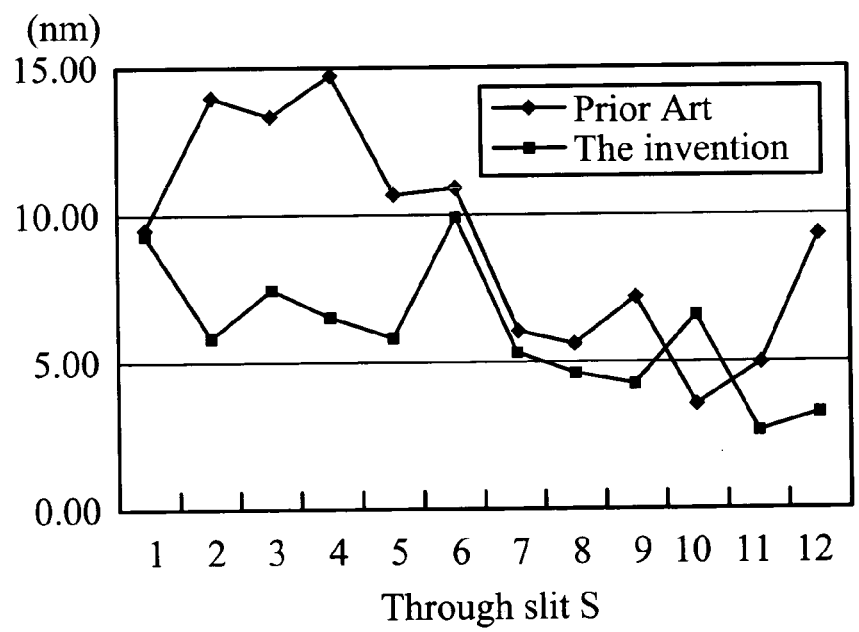
FIG. 4 is results of reducing effects of lens aberration in accordance with the invention.

FIG. 4 shows results of a pair of first transferred patterns 120' and 220' formed by transferring the first rectangular transparent patterns of the first reticles 12a and 120a onto a wafer under fixed photolithography parameters in accordance with the photolithography method of the prior art illustrated in FIG. 2b and the photolithography method of the invention illustrated in FIG. 3c.

CD differences of twelve sampling points through the slit field S in the photolithography between each two first transferred patterns 120' and 220' are measured and shown in FIG. 4. The CD target on the short side of first transferred patterns 120' and 220' is 155 nm.

Averaged CD differences between two adjacent first transferred patterns 120' formed by the photolithography method of the prior art is 9.26 nm and that between two first transferred patterns 220' formed by the photolithography method of the invention is 6.11 nm, less than the allowable process window of 5% of the CD target about 7.75 nm.

The photolithography method of the invention reduces the effects of lens aberration on photolithography and the CD differences between each pair of formed patterns thereof. Thus, the symmetry of each two adjacent transferred patterns is improved and overlap errors on subsequent device features can be reduced and overlay accuracy of the processes are also improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A photolithography method for reducing effects of lens aberration, comprising the steps of:

providing a photolithography apparatus with a first reticle therein, having at least one first rectangular pattern thereon;

providing a wafer and performing a first photolithography through the photolithography apparatus to transfer the first rectangular pattern onto the wafer by simultaneously moving the first reticle and the wafer in a direction parallel to the short sides of the first rectangular patterns;

replacing the first reticle with a second reticle, having at least one second rectangular pattern thereon; and performing a second photolithography through the photolithography apparatus to transfer the second rectangular pattern onto the wafer by simultaneously moving the second reticle and the wafer in a 90° plus or minus rotation in a direction parallel to the short sides of the second rectangular patterns.

2. The photolithography method as claimed in claim 1, wherein the photolithography apparatus is a step-scanner.

3. The photolithography method as claimed in claim 1, wherein the first rectangular pattern is for fabricating trench capacitors.

4. The photolithography method as claimed in claim 1, wherein the second rectangular pattern is for fabricating active areas.

5. The photolithography method as claimed in claim 1, wherein the wafer has an orientation mark indicating a relative location thereon.

6. The photolithography method as claimed in claim 5, wherein the orientation mark is a wafer notch.

7. The photolithography method as claimed in claim 5, wherein the movement of the orientation mark is perpendicular to that of the first reticle during the transfer of the first rectangular pattern.

8. The photolithography method as claimed in claim 5, wherein the movement of the orientation mark is parallel to that of the second reticle during the transfer of the second rectangular pattern.

9. The photolithography method as claimed in claim 1, wherein the movement of the wafer is the same as or opposite to that of the the first reticle and the second reticle.

10. A photolithography method for reducing effects of lens aberration, comprising the steps of:

providing a photolithography apparatus with a first reticle having at least one first rectangular transparent region thereon;

providing a wafer coated with a resist layer thereon;

performing a first photolithography through the photolithography apparatus to transfer the first rectangular transparent pattern onto the wafer by simultaneously moving the first reticle and the wafer coated with a resist layer thereon in a direction parallel to the short sides of the first transparent rectangular pattern;

performing developing and etching to form a device with a first transferred pattern having a long axis and a short axis on the wafer, wherein the long axis is perpendicular to the moving direction of the wafer;

replacing the first reticle with a second reticle having at least one second rectangular transparent pattern thereon;

providing the wafer having a device with the first transferred pattern coated with a resist layer;

performing a second photolithography through the photolithography apparatus to transfer the second rectangular transparent pattern onto the resist layer by simultaneously moving the second reticle and the wafer in a 90° plus or minus rotation in a direction parallel to the short sides of the second rectangular pattern; and developing and etching to form a device with the second transferred pattern on the wafer, having a long axis and a short axis, and overlapping the device with first transferred pattern thereunder, wherein the long axis thereof is perpendicular to the short axis of the underlying device with first transfer pattern.

11. The photolithography method as claimed in claim 10, wherein the photolithography apparatus is a step-scanner.

12. The photolithography method as claimed in claim 10, wherein the first rectangular transparent pattern is for fabricating trench capacitors.

13. The photolithography method as claimed in claim 10, wherein the second rectangular pattern is for fabricating active areas.

14. The photolithography method as claimed in claim 10, wherein the wafer has an orientation mark indicating a relative location thereon.

15. The photolithography method as claimed in claim 14, wherein the orientation mark is a wafer notch.

16. The photolithography method as claimed in claim 14, wherein the movement of the orientation mark is perpendicular to that of the first reticle during the transfer of the first transparent rectangular pattern.

17. The photolithography method as claimed in claim 14, wherein the movement of the orientation mark is parallel to that of the second reticle during the transfer of the second rectangular transparent pattern.

18. The photolithography method as claimed in claim 10, wherein the movement of the wafer is the same as or opposite to that of the the first reticle the second reticle.

* * * * *